(12) United States Patent
Kobayashi et al.

(10) Patent No.: US 6,649,732 B2
(45) Date of Patent: Nov. 18, 2003

(54) ALIPHATIC POLYESTER FILM AND GAS BARRIER FILM

(75) Inventors: Hisato Kobayashi, Ohtsu (JP); Keiji Mori, Ohtsu (JP); Naonobu Oda, Tsuruga (JP); Tadashi Okudaira, Ohtsu (JP)

(73) Assignee: Toyo Boseki Kabushiki Kaisha, Osaka (JP)

( * ) Notice: Subject to any disclaimer, the term of this patent is extended or adjusted under 35 U.S.C. 154(b) by 0 days.

(21) Appl. No.: 10/283,115

(22) Filed: Oct. 30, 2002

(65) Prior Publication Data

US 2003/0135020 A1 Jul. 17, 2003

Related U.S. Application Data

(62) Division of application No. 09/358,316, filed on Jul. 21, 1999, now Pat. No. 6,600,008.

(30) Foreign Application Priority Data

| Jul. 22, 1998 | (JP) | 10-206297 |
| Jul. 27, 1998 | (JP) | 10-211089 |
| Jul. 27, 1998 | (JP) | 10-211090 |
| Jul. 27, 1998 | (JP) | 10-211091 |
| Aug. 6, 1998 | (JP) | 10-223180 |
| Feb. 23, 1999 | (JP) | 11-045075 |

(51) Int. Cl.$^7$ .............................. B32B 27/36
(52) U.S. Cl. ............... 528/354; 528/271; 528/359; 528/361; 428/480; 428/910
(58) Field of Search ................ 528/354, 271, 528/359, 361; 428/480, 910

(56) References Cited

FOREIGN PATENT DOCUMENTS

| EP | 0 231 095 | 8/1987 |
| EP | 0 550 039 A2 | 7/1993 |
| EP | 05 76 993 | 1/1994 |
| EP | 06 83 207 | 11/1995 |
| EP | 0 688 806 A2 | 12/1995 |
| JP | 61-102232 | 5/1986 |
| JP | 03-131633 | 6/1991 |
| JP | 05-124100 | 5/1993 |
| JP | 05-179033 | 7/1993 |
| JP | 05-214135 | 8/1993 |
| JP | 06-057013 | 3/1994 |
| JP | 06-080793 | 3/1994 |
| JP | 06-114924 | 4/1994 |
| JP | 06-256480 | 9/1994 |
| JP | 06-262674 | 9/1994 |
| JP | 07-032470 | 2/1995 |
| JP | 07-205278 | 8/1995 |
| JP | 08-003333 | 1/1996 |
| JP | 08-176331 | 7/1996 |
| JP | 08-245771 | 9/1996 |
| JP | 08-323946 | 10/1996 |
| JP | 08-309847 | 11/1996 |
| JP | 09-067511 | 3/1997 |
| JP | 09-169075 | 6/1997 |
| JP | 9-2 67 997 | 10/1997 |
| JP | 09-300522 | 11/1997 |
| JP | 10-024518 | 1/1998 |
| JP | 10-100353 | 4/1998 |
| JP | 10-120811 | 5/1998 |
| JP | 10-138355 | 5/1998 |
| JP | 10-138433 | 5/1998 |
| JP | 10-219088 | 8/1998 |
| JP | 2000-037771 | 2/2000 |
| WO | 94 241 98 | 10/1994 |

OTHER PUBLICATIONS

Tadakazu Miyata et al., "*Uniaxial orientation behavior of poly (L–lactide) films*", Fiber, vol. 54, No. 5, pp. 261–269 (1998)—abstract.

"*Bioaxial oriented poly(lactide) film characteristics and use*", PACKPIA No. 523, vol. 2, pp. 12–19 (1996)—with partial translation.

Patent Abstracts of Japan, vol. 1998, No. 02, Jan. 30, 1998 & JP 09 278997 A (Mitsui Tatsu Chem Inc.), Oct. 28, 1997.

*Primary Examiner*—Duc Truong
(74) *Attorney, Agent, or Firm*—Kenyon & Kenyon

(57) ABSTRACT

A film of the present invention includes, as its main component, an aliphatic polyester whose primary repeating unit is represented by a general formula —O—CHR—CO— (where R denotes H or an alkyl group having a carbon number of 1–3). A three-dimensional surface roughness SRa of at least one side of the film is about 0.01 $\mu$m to about 0.1 $\mu$m. PCC value denoting the number of projections on the film per a unit of area along a mean roughness plane and the three-dimensional surface roughness SRa satisfy the following relationship: PCC value $\leq$ 7000-45000×SRa.

4 Claims, No Drawings

ALIPHATIC POLYESTER FILM AND GAS BARRIER FILM

RELATED U.S. APPLICATION DATA

This application is a divisional of U.S. application Ser. No. 09/358,316, filed Jul. 21, 1991 now allowed U.S. Pat. No. 6,660,008, the contents of which are herein incorporated by reference in its entirety.

BACKGROUND OF THE INVENTION

1. Field of the Invention

The present invention generally relates to a novel aliphatic polyester film.

In the first aspect, the present invention relates to an aliphatic polyester film having a desirable handling property, transparency, and adhesiveness, which is particularly suitable for packaging applications.

In the second aspect, the present invention relates to an aliphatic polyester film having a desirable suitability for processes such as printing and laminating processes, which is an important property of a packaging film for use with fresh food, processed food, drugs, medical devices, electronics, or the like, and also having a desirable heat seal strength after being made into a bag.

In the third aspect, the present invention relates to a novel aliphatic polyester film having a desirable suitability for processes such as printing and laminating processes.

In the fourth aspect, the present invention relates to a gas barrier film and, more particularly, to a gas barrier film which has desirable transparency, flexibility, running property during the film processing (i.e., the capability of smoothly running through the film-forming machine), and gas barrier property after the film has run through a film processing machine while being in contact with a part thereof. These are important properties required in a packaging film for use with fresh food, processed food, drugs, medical devices, electronics, or the like.

2. Description of the Related Art

Conventionally, various plastic materials such as a polyolefin (e.g., polyethylene, polypropylene), an aromatic polyester (e.g., polyethylene terephthalate), and a polyamide (e.g., nylon 6) have been used in packaging films for packaging various items such as food. Used packaging films are supposed to be collected, and either incinerated or buried underground. However, such collection requires a lot of effort. Therefore, as we know, some used packaging films are in fact left uncollected, creating various problems such as environmental pollution. When used films are incinerated, an excessively large heat is often generated which significantly damages the furnace, while the incineration requires a large amount of fuel and thus a high cost. When buried underground, on the other hand, used films, which are not biodegradable, remain in the soil on a semipermanent basis. In view of the current situations as described above, there is an increasing demand for a general-purpose packaging film which has a desirable biodegradability.

In order to provide a biodegradability to a polyethylene, or the like, various methods have been devised in the art in which a component having a biodegradability, e.g., starch, is blended with the film. Moreover, a method of providing a photo-degradability, and a method of blending a polyethylene provided with a photo-degradability and a starch component having a biodegradability, have been devised in the art. These methods have attracted public attention as methods which may possibly solve the above-described problems. With such methods, however, while the starch component having a biodegradability is degraded by microorganism, polymer components other than the starch are not degraded, thereby failing to completely solve the above-described problems.

Thus, along with the increasing public concern for environmental protection, there has been a demand for a plastic product which, when disposed in the natural environment, degrades or disappears over time without adversely affecting the natural environment.

In order to provide a complete solution to the above-described problems, various biodegradable polymer materials in which the polymer itself has a biodegradability have been devised in the art. Particularly, various polylactic acid materials have been actively developed in the art because a polylactic acid easily degrades when disposed in the natural environment. For example, a polylactic acid film is naturally hydrolized in the soil and then degraded by microorganisms into an environmentally harmless substance. For example, a polylactic acid film has been used in medical molded products (Japanese Publication for Opposition No. 41-2734, Japanese Publication for Opposition No. 63-68155, etc.), as well as in basic materials of other general-purpose disposable materials which are biodegradable.

Particularly, a biaxially drawn aliphatic polyester film is expected to be used in a wide variety of applications such as general packaging materials, because it has a transparency, a biodegradability, as well as mechanical properties comparable to those of commonly used films.

For example, Japanese Laid-Open Publication No. 7-207041 describes a biodegradable film having a practically acceptable strength and thermal dimensional stability, which is made of a polylactic acid-based polymer, and in which the degree of plane orientation $\Delta p$ is about $3.0 \times 10^{-3}$ or more, and ($\Delta Hm - \Delta Hc$) is about 20 J/g or more, which is the difference between the amount of crystallization melting heat $\Delta Hm$ resulting when heating the film and the amount of crystallization heat $\Delta Hc$ resulting from the crystallization during the heating.

However, these films have the following problems.

The first problem is as follows. Generally, a film is required to have a take-up property during a film-forming process, and a slipperiness during use. When the slipperiness is insufficient, the handling property during film production and film processing deteriorates. Due to the low slipperiness, the tension on the film increases while the film is running in contact with a guide roll, or the like, resulting in a frictional flaw on the film surface, thereby lowering the running property. Japanese Laid-Open Publication Nos. 8-34913 and 9-278997 disclose methods for improving the slipperiness and thus the handling property of a film. The improvement is provided by adding, to a film, an organic slip additive such as a fatty acid ester-based slip additive, a fatty acid-based slip additive, a fatty acid amide-based slip additive, as well as an inorganic minute particle anti-blocking agent such as silica and calcium carbonate.

However, when used in a packaging bag, a polylactic acid film needs to be laminated by a heat seal with a sealant film such as a polyolefin. With the addition of the organic slip additive as described in Japanese Laid-Open Publication Nos. 8-34913 and 9-278997 to apolylactic acid film in order to improve the handling property, the running property is improved, but the adhesion strength between the polylactic acid film and a sealant is reduced. Then, it is difficult to use such a film as a packaging bag because of the insufficient adhesion.

Thus, it has been difficult to improve the process suitability such as the printing process suitability or the handling property, which is required for a package film, while also improving the adhesiveness at the heat seal portion after the film is made into a bag, by the addition of only the above-described slip additive or the anti-blocking agent.

The second problem is as follows. The above-described polylactic acid-based film has been developed while preferentially improving the degradability in the natural environment. Consequently, the desirable properties inherent to an aliphatic polyester have not been sufficiently retained. In other words, the orientation and the crystallization of the film, as well as the strength and the thermal dimensional stability, have not been sufficient, because of the preferential improvement in the biodegradability thereof.

It has been found that, when used as a packaging film for fresh food, processed food, drugs, medical devices, electronics, or the like, such a film may experience a change in dimension or wrinkling in processes such as a printing process or a laminating process which are required for a packaging film.

The third problem is as follows. A polylactic acid film has a relatively high gas permeability. Thus, when a polylactic acid film is used in a food packaging material, there is a vital problem of shortening the storage period of the food packaged therein.

Japanese National Phase PCT Laid-Open Publication No. 8-505825 provides a solution to this problem by applying a vapor-deposited film of a metal such as aluminum on a film. However, a film obtained by this method has a reduced transparency, while the transparency of the film is required particularly in food packaging applications, and thus has seen a limited variety of applications.

In order to solve the problem, Japanese Laid-Open Publication No. 10-138433, Japanese Laid-Open Publication No. 10-24518, etc., propose a polylactic acid-based gas barrier film on which a vapor-deposited film of an inorganic oxide having a transparency is applied. While such a gas barrier film improves the transparency, the running property during the film processing and the gas barrier property after the film has run through a film processing machine while being in contact with a part thereof are not sufficient.

SUMMARY OF THE INVENTION

According to one aspect of this invention, a film includes, as its main component, an aliphatic polyester whose primary repeating unit is represented by a general formula —O—CHR—CO— (where R denotes H or an alkyl group having a carbon number of 1-3). A three-dimensional surface roughness SRa of at least one side of the film is about 0.01 $\mu$m to about 0.1 $\mu$m. PCC value denoting the number of projections on the film per a unit of area along a mean roughness plane and the three-dimensional surface roughness SRa satisfy the following relationship: PCC value $\leq$ 7000-45000$\times$SRa.

In one embodiment of the invention, the PCC value is about 1000/mm$^2$ or more.

In one embodiment of the invention, the aliphatic polyester is a polylactic acid.

According to another aspect of this invention, a film includes, as its main component, an aliphatic polyester whose primary repeating unit is represented by a general formula —O—CHR—CO— (where R denotes H or an alkyl group having a carbon number of 1-3). A refractive index (Nz) in a thickness direction thereof is about 1.440 to about 1.455. A surface energy of the film is about 45 dyne/cm or more.

In one embodiment of the invention, the film further includes a resin layer having a heat seal property.

In one embodiment of the invention, the resin layer having a heat seal property includes a polyolefin resin.

In one embodiment of the invention, the aliphatic polyester is a polylactic acid.

According to still another aspect of this invention, a film includes, as its main component, an aliphatic polyester whose primary repeating unit is represented by a general formula —O—CHR—CO— (where R denotes H or an alkyl group having a carbon number of 1-3). A thickness unevenness along a longitudinal direction of the film is about 10% or less. A thermal shrinkage along the longitudinal direction at about 120° C. is about 5% or less.

In one embodiment of the invention, a refractive index (Nz) along a thickness direction of the film is about 1.440 to about 1.455. The thermal shrinkage along the longitudinal direction at about 120° C. is about 3% or less.

In one embodiment of the invention, a value (Nx−Ny), which is obtained by subtracting a refractive index (Ny) in a width direction of the film from the refractive index (Nx) in the longitudinal direction thereof, is about −0.020 to about 0.

In one embodiment of the invention, a weight average molecular weight of the aliphatic polyester is about 10000 to about 500000.

In one embodiment of the invention, the aliphatic polyester is a polylactic acid.

According to still another aspect of this invention, a gas barrier film includes a resin layer and a vapor-deposited layer which is applied on at least one side of the resin layer. The resin layer includes, as its main component, an aliphatic polyester whose primary repeating unit is represented by a general formula —O—CHR—CO— (where R denotes H or an alkyl group having a carbon number of 1-3). The vapor-deposited layer is selected from the group consisting of an aluminum oxide/silicon oxide-based vapor-deposited layer, an aluminum oxide-based vapor-deposited layer and a silicon oxide-based vapor-deposited layer. A content of aluminum oxide in the aluminum oxide/silicon oxide-based vapor-deposited layer is about 20 wt % to about 99 wt %. A "b" value, which is calculated according to the following expression (1) based on a specific gravity D of the vapor-deposited layer and the aluminum oxide content A in wt % in the vapor-deposited layer, satisfies the following expression (2):

Expression (1): b=D−0.01A

Expression (2): 1.6$\leq$b$\leq$2.2

(where D denotes the specific gravity of the vapor-deposited layer, and A denotes the aluminum oxide content in wt % in the vapor-deposited layer). A specific gravity of the aluminum oxide-based vapor-deposited layer is about 2.70 to about 3.30. A specific gravity of the silicon oxide-based vapor-deposited layer is about 1.80 to about 2.20.

In one embodiment of the invention, a three-dimensional surface roughness S$\Delta$a (a three-dimensional average inclination gradient) of at least the deposition side of the resin layer is about 0.01 to about 0.04. Substantially no projection as high as about 1.89 $\mu$m or more exists on at least the deposition side of the resin layer.

In one embodiment of the invention, a thickness of the resin layer is about 10 $\mu$m to about 250 $\mu$m. A thickness of the vapor-deposited layer is about 10 Å to about 5000 Å.

In one embodiment of the invention, the aliphatic polyester is a polylactic acid.

Thus, the invention described herein makes possible the advantages of (1) providing an aliphatic polyester film useful as a general-purpose packaging film; (2) providing a biaxially drawn aliphatic polyester film having a desirable handling property, transparency and adhesiveness, which is particularly suitable for packaging applications; (3) providing a novel aliphatic polyester film having a desirable suitability for processes such as printing and laminating processes; and (4) providing a gas barrier film, which solves the above-described conventional problems in films and layered films, thereby being useful in general-purpose films by providing a desirable transparency, a desirable flexibility, a desirable running property during the film processing, and a desirable gas barrier property after the film has run through a film processing machine while being in contact with a part thereof.

These and other advantages of the present invention will become apparent to those skilled in the art upon reading and understanding the following detailed description.

DESCRIPTION OF THE PREFERRED EMBODIMENTS

"Aliphatic polyester" as used herein refers to a polyester whose primary repeating unit is represented by the general formula —O—CHR—CO— (where R is H or an alkyl group having a carbon number of 1–3).

While it is preferred that all of the repeating units in the aliphatic polyester are represented by the above general formula, other units which are not represented by the above general formula may also be included to an extent such that the properties of an aliphatic polyester are retained. For example, preferably about 70% or more, more preferably about 80% or more, even more preferably about 90% or more, and most preferably about 95% or more, of the repeating units in the molecule are those represented by the above general formula.

While an aliphatic polyester does not normally include an aromatic component, an aromatic component may employed to an extend such that the properties of the aliphatic polyester are retained. In such a case, preferably about 10 mol % or less, more preferably 5 mol % or less, and even more preferably 3 mol % or less, of the repeating units in the molecule are those including an aromatic structure.

Specific examples of the aliphatic polyester include, though are not limited to, a polylactic acid, a polyglycol acid, and a poly(2-oxyhydroxybutyric acid). A polylactic acid is currently most preferred in terms of performance and cost. The aliphatic polyester may be a homopolymer, or a copolymer of more than one of the repeating units selected from the group defined by the above-described general formula. Moreover, the aliphatic polyester may be a single polymer, or a mixture of more than one types of aliphatic polyesters.

When the carbon atoms forming the aliphatic polyester include any asymmetric carbon, there may exist optical isomers such as L-isomer, DL-isomer and D-isomer. Any of these optical isomers may be employed alone or as a mixture of two or more.

Moreover, other polymer materials may be mixed in the aliphatic polyester to an extent such that the desirable effects provided by the present invention are not inhibited. Where another polymer material is mixed in the aliphatic polyester, preferably about 70 wt %, more preferably about 80 wt %, even more preferably about 90 wt %, and most preferably about 95 wt %, of the total weight of the aliphatic polyester together with the other polymer material is aliphatic polyester.

The above-described aliphatic polyester (hereinafter, also referred to simply as "the polymer") may be produced as a material of a film of the present invention by using any appropriate method known in the art, e.g., a ring-opening polymerization of an anhydrous cyclic ester compound of a corresponding α-oxy acid.

The weight-average molecular weight of the above-described aliphatic polyester is preferably about 5000 to about 500000, more preferably about 10000 to about 500000, even more preferably about 40000 to about 300000, and most preferably about 50000 to about 300000. When the weight-average molecular weight is excessively low, the properties of an obtained biodegradable layered film are easily deteriorated, and the biodegradation speed tends to be too high. The weight-average molecular weight is preferably about 10000 or more in order to sufficiently ensure the extrudability from a film-forming machine and the drawability in a biaxial drawing machine. On the other hand, when the weight-average molecular weight is excessively high, the melting extrusion of the aliphatic polyester is difficult.

As necessary, any additive known in the art can be added to the above-described aliphatic polyester. For example, a slip additive, an anti-blocking agent, a thermal stabilizer, an antioxidant, an antistatic agent, a light-resistance agent, a shock resistance improver, a crystalline nucleus agent, an anti-coloring agent, a pigment, a dye, an ultraviolet absorber, a mold releasing agent, a slip-promoting agent, a flame retarder, and the like, may be added. For example, one or more of the following may be added as necessary in view of the antistatic property, etc.: an anionic surfactant such as a laurylphosphate potassium salt; a cationic surfactant such as a quaternary ammonium salt; a nonionic surfactant such as an aliphatic higher alcohol or an ethyleneoxide added higher aliphatic acid; a polyalkylene glycol such as a polyethylene glycol or a polyethylene glycol/polypropylene glycol block copolymer; and a silicone oil such as dimethylpolysiloxane, polyether denatured silicone oil, or a higher alkoxy denatured silicone oil. Moreover, one or more of the following may be added to the aliphatic polyester as necessary in order to variously adjust the mechanical properties, the biodegradability, etc.: a polymer such as a polyamino acid, or the like, an inorganic substance such as talc, calcium carbonate, calcium sulfate, calcium chloride, or a silicon oxide, starch, a protein, a food additive, and the like.

However, where the aliphatic polyester film is used in a transparent film application (e.g., in the fourth aspect of the present invention), the layered film on which a vapor-deposited layer of an oxide is deposited needs to be transparent so that the contents therein can be seen therethrough. Therefore, the types of additives to be added should be selected so that the film has a high transparency before applying the vapor-deposited layer.

For example, an inorganic particle, an organic salt particle or a cross-linked polymer particle may be added as a slip additive to the aliphatic polyester.

Specific examples of inorganic particles include a metal oxide such as silica, titanium dioxide, aluminum oxide, silicon oxide, and zirconium oxide, a metal salt such as calcium carbonate, calcium phosphate, kaolinite, kaoline, talc, magnesium carbonate, barium carbonate, calcium sulfate, lithium phosphate, calcium phosphate, magnesium phosphate, lithium fluoride, and barium sulfate.

Particularly, a silica particle aggregate of primary particles is preferably used as an inorganic particle for obtaining a film having a desirable handling property along with a low haze.

Specific examples of organic salt particles include calcium oxalate, or a terephthalate of calcium, barium, zinc, manganese, magnesium, or the like.

Specific examples of cross-linked polymer particles include a polymer or copolymer of a vinyl-based monomer such as divinylbenzene, styrene, acrylic acid, or methacrylic acid. More specifically, an organic polymer such as a cross-linked polystyrene resin, a cross-linked acrylic resin, and a cross-linked polyester resin may be used. Moreover, other organic particles such as polytetrafluoroethylene, a benzoguanamine resin, a thermosetting epoxy resin, an unsaturated polyester resin, a thermosetting urea resin, a thermosetting phenol resin, or a silicone resin may be used.

Such particles may be used preferably because they are inert to an aliphatic polyester.

Such slip additives may be used alone or in combinations of two or more. The average particle size of the slip additives used is preferably about 0.01 μm to about 3.0 μm, and more preferably about 0.05 μm to about 2.5 μm. In order to improve both the transparency and the slipperiness of the film, the amount of the slip additive to be added is preferably about 0.005 wt % to about 2 wt %, and more preferably about 0.01 wt % to about 1.0 wt of the total film composition.

In order to improve both the transparency and the slipperiness, it is preferred to use two or more slip additives in combination. Particularly, it is preferred to use a slip additive particle which deforms during the film formation (e.g., an organic slip additive having a low degree of cross link such as a cross-linked polystyrene resin or a cross-linked acrylic resin, or an inorganic slip additive such as a silica which is an aggregate of primary particles) in combination with another slip additive particle which does not deform during the film formation.

The method for adding the above-described slip additive to the aliphatic polyester is not limited to any particular method, but any appropriate method known in the art may be used. In the case where a polylactic acid is used as the aliphatic polyester, exemplary methods include those in which a slip additive is dispersed in a melted lactide before polymerization of the lactide, and those in which a slip additive is dispersed during the polymerization reaction of the lactide.

Film Formation Method

The aliphatic polyester composition thus prepared can be formed into a film by any appropriate method known in the art. After the film formation, the film is preferably further drawn by, for example, an uniaxial drawing method in which the film is drawn in either vertical or lateral direction, an inflation method, or a biaxial drawing method such as a simultaneous biaxial drawing method or a successive biaxial drawing method. When using the successive biaxial drawing method, either the vertical drawing step or the lateral drawing step may be performed first. Moreover, various other drawing methods such as a lateral/vertical/vertical drawing method, a vertical/lateral/vertical drawing method, and a vertical/vertical/lateral drawing method may alternatively be used. As necessary, the film may be further subjected to a thermofixing process, a vertical relaxation process or a lateral relaxation process. More preferably, the film is thermally fixed after the biaxial drawing.

For example, the film may be biaxially drawn and then thermally fixed after being formed by an extrusion machine.

For example, when an aliphatic polyester film is produced by an extrusion molding method, a T-die method or an inflation method, which are known in the art, may be used so as to obtain an undrawn film. The extrusion temperature may be about Tm to about Tm+70° C., and more preferably about Tm+20° C. to about Tm+50° C., where Tm is the melting temperature of the biodegradable aliphatic polyester used. When the extrusion temperature is excessively low, it may be difficult to stably perform the extrusion molding because of an excessive load applied to the extrusion machine. When the extrusion temperature is excessively high, the aliphatic polyester is undesirably easily degraded. The die of the extrusion machine used for producing the aliphatic polyester film may be those having circular or linear slits. Moreover, the temperature of the die may be substantially equal to the extrusion temperature.

The biaxial drawing of an undrawn film of the aliphatic polyester may be done by successively performing two drawing steps one along the first axis direction and another along the second axis direction, or by simultaneously performing two drawing steps.

The drawing temperature is preferably about Tg to about Tg+50° C., and more preferably about Tg+10° C. to about Tg+40° C., where Tg is the glass-transition temperature of the aliphatic polyester used. When the drawing temperature is excessively low, the drawing process is difficult to perform. When the drawing temperature is excessively high, the uniformity in thickness and the mechanical strength of the obtained film may undesirably be reduced.

Each of the vertical and lateral drawing processes may be performed in a single stage or in a plurality of stages. In any case, in terms of the uniformity in thickness and the mechanical properties, it is preferred to finally achieve a drawing ratio of about 3 or more, and more preferably about 3.5 or more, in either drawing direction, or a drawing ratio in area of about 9 or more, and more preferably about 12 or more. When the vertical or lateral drawing ratio is about 3 or less, or 9 or less in area, it may be difficult to obtain a film having a desirable uniformity in thickness, or to sufficiently improve the properties such as the mechanical strength. The thickness of the resin layer whose main component is an aliphatic polyester is normally about 10 μm to about 250 μm, and preferably about 12 μm to about 250 μm.

Herein, the longitudinal direction in a biaxially drawn film refers to the vertical drawing direction, while the width direction refers to the lateral drawing direction.

The upper limit of the drawing ratio is not limited to any particular ratio, though it is preferred to control the drawing ratio so that the film will not be ruptured during the drawing process.

The aliphatic polyester film may be produced as a multilayer film by using a coextrusion process with another resin or providing an additional coating process.

For particular applications, a corona discharge treatment, a coating treatment, a plasma treatment, or a flame treatment, may be performed in order to improve the surface energy of the aliphatic polyester film or to improve the adhesiveness or the wettability thereof. Particularly, before an oxide vapor-deposited layer is deposited on the film, the above-described treatment may be performed in advance so as to improve the adhesiveness between the film and the oxide vapor-deposited layer.

First Aspect of the Present Invention

According, to the first aspect of the present invention, the three-dimensional surface roughness SRa of the biaxially drawn aliphatic polyester film is about 0.01 μm or more. When the three-dimensional surface roughness SRa is less than about 0.01 μm, the handling property will be poor. When the three-dimensional surface roughness SRa is more than about 0.1 μm, the transparency and/or the anti-erosion property will be poor.

Moreover, the number of projections per a unit of area (PCC value) along the mean roughness plane of the biaxially drawn aliphatic polyester film is preferably about $1000/mm^2$ or more. When the PCC value is excessively low, the handling property or the running property are likely to be poor.

When the PCC value is outside the following range: PCC value$\leq 7000\text{-}45000\times SRa$, the transparency will be poor.

The PCC value denoting the number of projections along the mean roughness plane, and the three-dimensional surface roughness SRa, may be adjusted by controlling the film formation conditions and the slip additive particles. The type of slip additive used and the amount of the slip additive added are not limited to any particular type or amount as long as the PCC value and the three-dimensional surface roughness SRa are within predetermined ranges. Preferably, the slip additive is an inorganic particle. The average particle size of the slip additive is preferably about 0.01 $\mu$m to about 5 $\mu$m, and more preferably about 1 $\mu$m to about 4 $\mu$m. The amount of slip additive added is preferably about 0.01 wt % to about 0.8 wt %, and more preferably about 0.03 wt % to about 0.5 wt %.

Herein, the mean roughness plane refers to a plane such that the total volume of upper portions of the protrusions on the film existing above the plane is equal to the total volume of the space defined between lower portions of the protrusions on the film existing below the plane.

When the average particle size of the slip additive is excessively small, it is difficult to control the three-dimensional surface roughness SRa to be about 0.01 $\mu$m or more. When the average particle size of the slip additive is excessively large, it is often difficult to control the PCC value to be about 1000/mm2 or more and the three-dimensional surface roughness SRa to be about 0.1 $\mu$m or less. When the amount of slip additive added is excessively small, it is difficult to control the PCC value to be about $1000/mm^2$ or more and the three-dimensional surface roughness SRa to be about 0.01 $\mu$m or more. When the amount of slip additive added is excessively large, it is often difficult to control the three-dimensional surface roughness SRa to be about 0.1 $\mu$m or less.

As necessary, an organic slip additive, in addition to the above-described slip additives, may be further added to the film according to the first aspect of the present invention. As the organic slip additive, a hydrocarbon resin, a fatty acid ester, paraffin, a higher fatty acid, aliphatic ketone, and a fatty acid amide, and the like, are known in the art.

According to the first aspect of the present invention, it is possible to provide the slipperiness by controlling the SRa value and the PCC value, which are related to the surface profile of the film, to be within predetermined ranges. Therefore, it may not be necessary to add an organic slip additive. Moreover, the addition of an organic slip additive often results in a bleed-out of the organic slip additive across the film surface. In such a case, the adhesion strength after laminating the film with a sealant film of a polyolefin, or the like, is often insufficient. Therefore, it may be preferred not to add an organic slip additive.

According to the first aspect of the present invention, the film drawing conditions may vary depending upon the slip additive to be added. The film drawing conditions are selected so that the PCC value along the mean roughness plane and the three-dimensional surface roughness SRa fall within predetermined ranges.

For example, where the film is first drawn in the vertical direction in one or more stages and then drawn in the lateral direction, the refractive index (Nx) in the vertical direction after the vertical drawing process is preferably about 1.555 or less. When Nx is excessively large, the formation of the surface projections during the production process is often insufficient, whereby the handling property or the running property may be poor.

In a preferred embodiment of the present invention, a resin layer having a heat seal property, i.e., a sealant layer, is laminated on the aliphatic polyester film. A polyolefin resin, e.g., polypropylene and polyethylene, is preferably used for the resin layer having a heat seal property.

As necessary, an adhesion improving layer may be deposited on the film of the present invention. The adhesion improving layer as used herein refers to a layer which is provided on the aliphatic polyester film for improving the adhesive strength between the aliphatic polyester film and other various layers such as the sealant layer. The material of the adhesion improving layer may be any appropriate material which may improve the adhesive strength between the sealant layer and the aliphatic polyester film. For example, the material may be one selected from a polyester, an acrylic resin, a polyurethane, and the like, or a copolymer (including a block copolymer and a graft copolymer) of two or more selected therefrom.

An additive such as an antistatic agent, an in organic slip additive, an ultraviolet absorber, an organic slip additive, an antibacterial agent, or a photo-oxidization catalyst, may be added to the adhesion improving layer to an extent such that the desirable effects provided by the present invention are retained. Such an additive may be provided to the surface of the aliphatic polyester film by including the additive in a coating which contains a resin of the adhesion improving layer.

Any appropriate coating method known in the art such as a gravure method, a reverse method, a die method, a bar method, or a dip method, may be used for coating the aliphatic polyester film with a coating material containing the above-described adhesion-modifying material in order to provide the adhesion improving layer.

The amount of coating solution (as a solid content) is preferably about 0.005 $g/m^2$ to about 10 $g/m^2$, and more preferably about 0.02 $g/m^2$ to about 0.5 $g/m^2$. When the amount of coating is excessively small, it is difficult to obtain a sufficient adhesive strength between the aliphatic polyester film and the sealant layer. When the amount of coating is excessively large, blocking, and other problems in practical use, are likely to occur.

The adhesion improving layer may be provided by coating the aliphatic polyester film with the above-described coating material. Alternatively, the adhesion improving layer may be provided by first coating an undrawn or uniaxially drawn aliphatic polyester film with the above-described coating material, drying the coated film, and then, as necessary, further uniaxially or biaxially drawing the resulting film and thermally fixing the same.

Where the adhesion improving layer is laminated on the aliphatic polyester film, a corona treatment, a flame treatment, a surface treatment using an electron beam irradiation may be performed in order to further improve the adhesiveness of between the aliphatic polyester film and the adhesion improving layer.

Where an undrawn or uniaxially drawn aliphatic polyester film is coated with the above-described coating solution, dried, and further drawn, the temperature at which the drying process is performed after the coating is adjusted so as not to affect the subsequent drawing process. By performing a thermofixing process at a temperature of about 140° C. or more after the further drawing process, the coating film can be made hard while dramatically improving the adhesiveness between the adhesion improving layer and the aliphatic polyester film.

The adhesion improving layer thus provided on the aliphatic polyester film has a desirable adhesiveness with respect to various materials. Still, in order to further improve the adhesiveness or the printing property, the adhesion improving layer may be further subjected to a surface treatment using a corona treatment, a flame treatment, or an electron beam irradiation.

The adhesion-facilitated aliphatic polyester film obtained by the first aspect of the present invention has a desirable adhesive strength with respect to various types of layers having various functions and may be used in a wide range of applications. For example, the various types of layers having various functions may include a photosensitive layer in a photograph, a diazo type photosensitive layer, a mat layer, a magnetic layer, an ink-jet ink receiving layer, a hard coat layer, a printing ink or UV ink receiving layer, an adhesive layer used when providing a laminated film by dry lamination or extrusion lamination, or the like, a thin film layer used in electron beam deposition, sputtering, ion plating, CVD, plasma polymerization, or the like, and an organic barrier layer.

Second Aspect of the Present Invention

According to the second aspect of the present invention, the refractive index in the thickness direction (Nz) may be adjusted by any appropriate method to be within a predetermined range.

For example, a process in which the vertical drawing is performed in two or more stages, at least one of which is performed at a temperature of about Tg+20° C. to about Tg+40° C. and at a drawing rate of about 10000%/min, preferably about 15,000%/min, and more preferably about 20000%/min or more, may be used.

The refractive index in the thickness direction (Nz) of the aliphatic polyester film according to the second aspect of the present invention needs to be about 1.440 to about 1.455, and more preferably about 1.445 to about 1.455. When the value Nz is excessively small, the film may easily be ruptured during a film forming process, and wrinkling, planarity deterioration, and the like, may occur during a printing, laminating or heat seal process, or the like, while the heat seal strength may be poor. When the value Nz is excessively large, wrinkling, planarity deterioration, elongation, or the like, may occur during a printing, laminating or heat seal process, or the like, thereby reducing the process suitability of the film.

The film surface energy of the aliphatic polyester film according to the second aspect of the present invention is about 45 dyne/cm or more, and preferably about 47 dyne/cm or more. When the surface energy is excessively small, the heat seal strength is likely to be insufficient.

In a preferred embodiment of the present invention, a resin layer having a heat seal property, i.e., a sealant layer, is laminated on the aliphatic polyester film. A polyolefin resin, e.g., polypropylene, polyethylene, and the like, is preferably used for the resin layer having a heat seal property.

The heat seal layer contains a polyolefin resin as its main component, and is deposited by a method such as dry lamination or extrusion lamination. In a method typically employed in dry lamination, the coating of an adhesive layer is done by a gravure coating method, a reverse kiss roll coating method, or a reverse roll coating method. Then, the coated layer is dried, and then a polyolefin film having a heat seal property is laminated thereon. The adhesive used may be a two-part urethane-based adhesive in which a base having an OH group is mixed with a curing agent having an NCO group, or other isocyanate-based adhesives, etc. An exemplary polyolefin resin may be a polyethylene, a polypropylene, a copolymer thereof, or the like.

Third Aspect of the Present Invention

According to the third aspect of the present invention, the thickness unevenness and the thermal shrinkage may be adjusted by any appropriate method.

For example, a process in which the vertical drawing is performed by two or more stages, at least one of which is performed at a temperature of about Tg+20° C. to about Tg+40° C. and at a drawing rate of about 10000%/min, preferably about 15000%/min, and more preferably about 20000%/min or more, may be used. The upper limit of the drawing rate is not limited to any particular rate as long as the formed film will not be ruptured.

In order to further reduce the thickness unevenness, it is effective to perform, after the above-described biaxial drawing process and before the thermofixing process, a fixed-length heat treatment at a temperature of about Tg−10° C. to about Tg+40° C., more preferably about Tg to about Tg+30° C. (where Tg is the glass-transition temperature of the biaxially drawn film) for about 1 second to about 600 seconds. When the temperature of the heat treatment is excessively low, the effect of the heat treatment may not be sufficiently obtained. When the temperature of the heat treatment is excessively high, it is often difficult to improve the thickness unevenness after the heat treatment, thereby rather increasing the thickness unevenness.

The mechanism by which the heat treatment, performed between the biaxial drawing process and the thermofixing process, provides the desirable effect on the thickness unevenness is not known. It is assumed that such a heat treatment promotes the orientation crystallization after the drawing process so as to relax the polymer chain during the thermofixing process and thereby to suppress the thickness unevenness.

After the film is biaxially drawn, a thermofixing process is preferably performed. The thermofixing process is performed at a temperature of normally about 150° C. to about Tm, preferably about 155° C. to about Tm. Preferably, a lateral relaxing process is further performed after the thermofixing process. Preferably, a lateral relaxing process of about 1% to about 10%, more preferably about 2% to about 8%, is performed at a temperature of about 120° C. to about the thermofixing temperature.

As described above, the film may further be laminated into a multilayer film, or subjected to the above-described surface treatment.

The thickness unevenness in the longitudinal direction of the aliphatic polyester film according to the third aspect of the present invention needs to be about 10% or less, preferably about 8% or less, more preferably about 5% or less. The thickness unevenness is expressed as a percentage of the difference between the maximum thickness and the minimum thickness with respect to the average thickness as the thicknesses are measured continuously along the longitudinal direction of the film over a length of, for example, about 3 m. When the thickness unevenness is excessively large, the film is heated with a film-carrying tension being applied thereof during a process such as a printing process or a laminating process. In such a case, the planarity of the film varies along the longitudinal direction thereof, and undesirable planarity may occur, whereby the production yield of the final product is likely to decrease. The film thickness is preferably about 5 $\mu$m to about 50 $\mu$m.

In the third aspect of the present invention, the thermal shrinkage of the aliphatic polyester film at a temperature of about 120° C. in the longitudinal direction needs to be about 5% or less, preferably about 3% or less. When the thermal shrinkage is excessively large, printing misalignment easily occurs in a printing process, and wrinkling easily occurs in a heat seal process.

The refractive index in the thickness direction (Nz) of the aliphatic polyester film according to the third aspect of the present invention is preferably about 1.440 to about 1.455, and more preferably about 1.445 to about 1.455. When the value Nz is excessively small, the film may easily be ruptured during a film forming process, and wrinkling, planarity deterioration, and the like, may occur during a printing, laminating or heat seal process, or the like, while the heat seal strength may be poor. When the value Nz is excessively large, planarity deterioration, elongation, or the like, may easily occur because the film is heated during a printing, laminating or heat seal process, or the like.

According to the preferred embodiment of the third aspect of the present invention, the value (Nx−Ny) obtained by subtracting the refractive index (Ny) in the width direction of the aliphatic polyester film from the refractive index (Nx) in the longitudinal direction thereof is preferably about −0.020 to about 0, more preferably about −0.015 to about 0. When the value Nx−Ny is excessively small, the film, when heated during a printing or laminating process, or the like, is stretched by the film-carrying tension, whereby printing misalignment and ruffling may easily occur in the printing process, and the planarity is likely to deteriorate. When the value Nx−Ny is excessively large, the thickness unevenness is likely to increase.

In a preferred embodiment of the present invention, a resin layer having a heat seal property, i.e., a sealant layer, is deposited on the aliphatic polyester film. A polyolefin resin, e.g., polypropylene, polyethylene, and the like, is preferably used for the resin layer having a heat seal property.

Fourth Aspect of the Present Invention

An embodiment of a layered film having a desirable gas barrier property according to the fourth aspect of the present invention will be described below.

In the fourth aspect of the present invention, the oxide vapor-deposited layer may be formed by appropriately using a physical vapor deposition method such as a vacuum deposition method, a sputtering method, or an ion plating method, or a chemical vapor deposition method such as CVD. The method for heating employed may be a resistance heating method, an induction heating method, an electron beam heating method, or the like. It is also possible to use a reactive vapor deposition method in which an oxygen gas, a nitrogen gas, a hydrogen gas, an argon gas, a carbonic acid gas, a water vapor, or the like, is introduced as a reactive gas, or those employing addition of ozone, an ion assist, or the like. Alternatively, it is possible to apply a bias voltage across the aliphatic polyester film, as a substrate, or to change conditions such as a heating condition, a cooling condition, or the like, under which the aliphatic polyester film is deposited depending upon the vapor deposition method used. Similarly, where a sputtering method or a CVD method is employed, the material to be deposited, the reactive gas, the aliphatic polyester film bias, the heating or cooling condition for the aliphatic polyester film may be changed to be suitable for the vapor deposition method used. It is also effective to perform, before or during the vapor deposition, a corona discharge treatment, a flame treatment, a low temperature plasma treatment, a glow discharge treatment, a reverse sputtering treatment, a surface roughening treatment, or the like, on the surface of the aliphatic polyester film onto which the material is deposited, so as to further improve the adhesion strength of the vapor-deposited layer.

An aluminum oxide/silicon oxide-based vapor-deposited layer is considered to be a mixture of aluminum oxide and silicon oxide and/or a mixture containing a compound of aluminum, silicon, and oxygen. Aluminum oxide in the vapor-deposited layer comprises a mixture of various aluminum oxides such as Al, AlO, $Al_2O_3$, and the like, and the respective contents, etc., of the aluminum oxides vary depending upon the condition under which the vapor-deposited layer is applied. Silicon oxide is considered to comprise Si, SiO, $SiO_2$, and the like, and the ratio thereof varies depending upon the condition under which the vapor-deposited layer is applied. The content of the aluminum oxide in the vapor-deposited layer is about 20 wt % to about 99 wt %, preferably about 30 wt % to about 95 wt %. A slight amount (preferably up to about 3% with respect to the total component of the vapor-deposited layer) of one or more other component may be included to an extent such that the desirable properties of the vapor-deposited layer are retained.

The aluminum oxide-based vapor-deposited layer is considered to comprise Al, AlO, $Al_2O_3$, and the like, and the ratio thereof varies depending upon the condition under which the vapor-deposited layer is applied.

The silicon oxide-based vapor-deposited layer is considered to comprise Si, SiO, $SiO_2$, and the like, and the ratio thereof varies depending upon the condition under which the vapor-deposited layer is applied.

The term "specific gravity" as used herein refers to a ratio of a weight of a substance having a certain volume at a certain temperature with respect to the weight of a standard substance (water at about 4° C.) having the same volume. Normally, the specific gravity of a substance can be measured by measuring the weight and volume of the substance and calculating the weight ratio thereof with respect to the same volume of water at about 4° C. However, the volume of an vapor-deposited layer is difficult to measure. Therefore, the vapor-deposited layer may need to be first separated, by stripping it from the aliphatic polyester film on which it has been deposited, or dissolving only the aliphatic polyester film from the vapor-deposited film, thereby obtaining a film solely of the vapor-deposited layer. Then, a specific gravity measurement method such as those described in JISK7112 is preferably used. For example, in a sink and float method, a sample is immersed in a solution having a known specific gravity, so as to determine the specific gravity of the vapor-deposited layer based on the sinking/floating thereof in the solution. A mixture of carbon tetrachloride and bromoform, methylene iodide, or the like, may be used as the solution having a known specific gravity. The specific gravity of a sample can also be measured by a density gradient tube method in which a sample, e.g., a separated film, is immersed in various solutions having continuously different density gradients.

Where an aluminum oxide/silicon oxide vapor-deposited layer is employed, the "b value" calculated as follows is set to be about 1.6 to about 2.2, preferably about 1.7 to about 2.0. The b value is calculated from Expression 1 below:

Expression 1: $b = D − 0.01A$ where D denotes the specific gravity of the vapor-deposited layer, and A denotes the weight percent of the aluminum oxide in the vapor-deposited layer. When the b value is excessively small, the structure of the aluminum oxide/ silicon oxide vapor-deposited layer will be coarse, and the gas barrier property will be insufficient. When the b value is excessively large, the initial gas barrier property immediately after the film formation will be desirable, but the film will be excessively hard, and will have poor mechanical properties, particularly, a poor Gelbo property. Moreover, after the film is dynamically fatigued from repeated bending, etc., for example, the gas barrier property is significantly reduced, thereby detracting from its utility as a gas barrier film.

Where an aluminum oxide-based vapor-deposited layer is used as the vapor-deposited layer, the specific gravity of the aluminum oxide-based vapor-deposited layer is preferably about 2.70 to about 3.30, more preferably about 2.80 to about 3.20. When the specific gravity of the vapor-deposited layer is excessively small, the structure of the aluminum oxide-based vapor-deposited layer will be coarse, and the gas barrier property will be insufficient. When the specific gravity vapor-deposited layer is excessively large, the initial gas barrier property immediately after the film formation will be desirable, but the film will be excessively hard, and will have poor flexibility. After the film is dynamically fatigued from repeated bending, for example, the gas barrier property is significantly reduced, thereby detracting from its utility as a gas barrier film.

Where a silicon oxide-based vapor-deposited layer is used as the vapor-deposited layer, the specific gravity of the silicon oxide-based vapor-deposited layer is preferably about 1.80 to about 2.20, more preferably about 1.90 to about 2.15. When the specific gravity of the vapor-deposited layer is excessively small, the structure of the silicon oxide-based vapor-deposited layer will be coarse, and the gas barrier property will be insufficient. When the specific gravity of the vapor-deposited layer is excessively large, the initial gas barrier property immediately after the film formation will be desirable, but the film will be excessively hard, and the flexibility thereof easily deteriorates. Thus, the gas barrier property significantly decreases after the process, thereby detracting from its utility as a gas barrier film.

It is possible to obtain a gas barrier film having a desirable flexibility by applying the above-described vapor-deposited layer on the aliphatic polyester film.

A feature of the preferred embodiment is the adjustment of the surface state of the aliphatic polyester film. That is, according to the preferred embodiment of the present invention, the three-dimensional surface roughness $S\Delta a$ (the three-dimensional average inclination gradient) of at least the deposition side of the aliphatic polyester film is adjusted to be about 0.01 to about 0.04, thereby obtaining a film having a desirable running property during the film processing and a desirable gas barrier property after the film processing. When the value $S\Delta a$ is less than about 0.01, the running property during the film processing will be poor, and the film surface after the film has been run will be significantly rough, reducing the gas barrier property. When the value $S\Delta a$ is more than about 0.04, the transparency and/or the anti-erosion property are likely to be poor, thereby deteriorating the film quality.

In a preferred embodiment, substantially no projection as high as about 1.89 $\mu$m or more exists on the surface of the aliphatic polyester film. When there is a projection which is as high as about 1.89 $\mu$m or more, the transparency is likely to be poor, and the anti-erosion property is also likely to be reduced, thereby generating white powder.

Normally, the thickness of the vapor-deposited layer is preferably about 10 Å to about 5000 Å. When the film thickness is excessively small, it is difficult to obtain a sufficient gas barrier property. An excessively large film thickness is also impractical, because it is likely to reduce the flexibility and increase the production cost, while saturating the gas barrier property, which then can no longer be improved.

The aliphatic polyester film with an vapor-deposited layer applied thereon according to the fourth aspect of the present invention needs to be colorless and transparent, so that the contents therein can be seen therethrough. Therefore, the haze of the deposition film is preferably low, e.g., about 5% or less.

On the aliphatic polyester film having the vapor-deposited layer being applied thereon, one or more other layer may be formed to an extent such that the object of the invention is realized.

In a preferred embodiment of the present invention, a resin layer having a heat seal property, i.e., a sealant layer, is deposited on the aliphatic polyester film. A polyolefin resin, e.g., polypropylene and polyethylene, is preferably used for the resin layer having a heat seal property.

EXAMPLES

The present invention will now be described in more detail by way of illustrative examples and comparative examples which are not intended to limit the present invention.

First, evaluations of various properties used in the various examples and comparative examples below will be described.

(1) Three-Dimensional Surface Roughness SRa

In Example A, the surface roughness of the film was measured with a stylus type three-dimensional surface roughness meter (SE-3AK manufactured by Kosaka Kenkyusho). First, the surface roughness of the film was measured over about 1 mm along the longitudinal direction thereof under conditions including a stylus radius of about 2 $\mu$m, a load of about 30 mg, a cut-off value of about 0.25 mm, and a stylus speed of about 0.1 mm/sec. The obtained data was divided into 500 points at about 2 $\mu$m intervals, and the height at each point was input to a three-dimensional surface roughness analyzer (SPA-11) at a quantization width of about 0.00312 $\mu$m. Similarly, the surface roughness of the film was measured over about 0.3 mm along the width direction thereof, for 150 points at about 2 $\mu$m intervals, and the data at each point was input to the analyzer.

Each obtained surface roughness curve was approximated to a sine curve. The average roughness was obtained using a mean roughness plane as a reference plane.

Specifically, the value SRa as used herein refers to a value obtained by using the above-described stylus type three-dimensional surface roughness meter to measure the heights of the sample film at a predetermined number of measurement positions which are arranged at regular intervals, and processing the measured values by the above-described three-dimensional surface roughness analyzer.

A rectangular coordinates system is defined along the mean roughness plane with an X axis and a Y axis as well as a Z axis, which is defined orthogonal to the mean roughness plane. The value SRa is obtained from a portion of the mean roughness plane having a length Lx along the X axis, and a length Ly along the Y axis, with an area of $Lx \times Ly = S_M$, according to the following expression. The obtained value SRa is expressed in $\mu$m.

$$SRa = \frac{1}{S_M} \int_0^{L_x} \int_0^{L_y} |f(x, y)| dx dy$$

Herein, Z=f(x,y) denotes a function representing a film surface, i.e., the height Z, at a position (x,y) in the rectangular coordinates system as defined above.

In Example A, the SRa value was calculated according to the above expression, with Lx=500 and Ly=150.

(2) PCC Value

In Example A, the number of projections per 1 mm² as high as about 0.00625 µm or more with respect to a standard surface having a standard height, which was used in the calculation of SRa value, was counted.

(3) Haze

In Examples A and D, the haze was measured by 300A manufactured by Nihon Seimitsu Kogaku according to JIS-K6714.

(4) Refractive Index

In Example A, the refractive index of the film along the longitudinal thereof was obtained by using Abbe's Refractometer 1T manufactured by Atago Co., Ltd.

In Example B, the refractive index (Nz) of the film along the thickness direction thereof was measured by Abbe's Refractometer 1T manufactured by Atago Co., Ltd.

In Example C, the refractive indices (Nz, Nx, Ny) of the film along the thickness direction, the longitudinal direction, and the width direction, respectively, were measured by Abbe's Refractometer 1T manufactured by Atago Co., Ltd.

(5) Handling Property of Film

In Example A, a film wound around a wide roll was slit at a high speed, and re-wound around a narrower roll. Then, the film was evaluated into one of four grades as defined below based on the quality of the obtained roll in terms of the winding misalignment, wrinkling, bubbles, etc.

Grade 1: Very difficult to obtain acceptable slit roll

Grade 2: Acceptable slit roll can be obtained at low speed

Grade 3: Acceptable slit roll can be obtained at medium speed

Grade 4: Acceptable slit roll can be obtained at high speed (6) Adhesiveness Evaluation In Example A, about 2 g/m² of an adhesive AD585/CAT-10 (manufactured by Toyo Morton) was applied on a surface of each of biaxially drawn aliphatic polyester films obtained in various examples and comparative examples on which a corona treatment has been performed. Then, about 60 µm of an undrawn polypropylene film (P1120 manufactured by Toyobo Co., Ltd.) was attached thereon by a dry laminate method so as to provide a sealant layer, thereby obtaining a layered product of the biaxially drawn aliphatic polyester film. The peel strength of the product in a dry state and that in a wet state were measured. The measurement was conducted by a 90° peel test at a pulling speed of about 100 mm/min. In Table A below, "Dry" denotes a value measured at a temperature of about 23° C. and a humidity of about 65%, whereas "Wet" denotes a value measured while the film sample was made wet by dripping water thereto using a pippet.

(7) Surface Energy

In Example B, various wetting index standard solutions (manufactured by Nacalai Tesque Co., Ltd.) were applied on the film over a width of about 1 cm and a length of about 6 cm. Then, a reagent with which the film shrinks in about 2 seconds was selected so as to measure the surface energy.

(8) Process Suitability

In Example B, a printing ink layer was provided by printing a gravure ink (Lamiace 61 white 2 liquid type manufactured by Toyo Ink Manufacturing Co., Ltd.) on each of layered thermoplastic films obtained in various examples and comparative examples. Then, after about 2 g/m² of an adhesive AD585/CAT-10 (manufactured by Toyo Morton) was applied thereon, about 60 µm of an undrawn polypropylene film (P1120 manufactured by Toyobo Co., Ltd.) was attached thereon by a dry laminate method so as to provide a sealant layer, thereby obtaining a layered product of the aliphatic polyester film. The quality of each of the obtained layered products was observed and evaluated into one of three grades as defined below.

○: Good quality

Δ: Some planarity deterioration observed, but acceptable in terms of wrinkling and printing misalignment X: Planarity deterioration observed, and unacceptable in terms of wrinkling and printing misalignment (9) Heat Seal Strength In Example B, the peel strength in the dry and wet states of the layered product as described in (8) above. The measurement was conducted by a 90° peel test at a pulling speed of about 100 mm/min. In Table B below, "Without water" denotes a value measured at a temperature of about 23° C. and a humidity of about 65% RH, whereas "With water" denotes a value measured while the film sample was made wet by dripping water thereto using a pippet.

(10) Thickness Unevenness Along the Longitudinal Direction

In Example C, the thickness of the film was measured continuously over about 3 m along the longitudinal direction thereof using a "Film thickness continuous measuring apparatus" manufactured by Anritsu Corp. The thickness unevenness was calculated according to the following expression:

Thickness unevenness (%)=[(maximum thickness−minimum thickness)/average thickness]×100

(11) Thermal Shrinkage Along the Longitudinal Direction

In Example C, the film was cut into a piece about 10 mm wide and about 250 mm long. The piece of film was marked at an about 200 mm interval, and the interval defined by the mark was measured as a value "A" under a constant tension of about 5 g. Successively, the film piece was placed in an oven, whose atmosphere was at about 120° C. After about 30 minutes with no load applied, the film piece was taken out of the oven, and the interval defined by the mark was measured as a value "B" under a constant tension of about 5 g. The thermal shrinkage was obtained according to the following expression:

Thermal shrinkage (%)=[(A−B)/A]×100

(12) Process Suitability

In Example C, a printing ink layer was provided by printing a gravure ink (Lamiace 61 white 2 liquid type manufactured by Toyo Ink Manufacturing Co., Ltd.) on each of thermoplastic films obtained in various examples and comparative examples. Then, after about 2 g/m² of an adhesive AD585/CAT-10 (manufactured by Toyo Morton) was applied thereon, about 60 µm of an undrawn polypropylene film (P1120 manufactured by Toyobo Co., Ltd.) was attached thereon by a dry laminate method so as to provide a sealant layer, thereby obtaining a layered product of the aliphatic polyester film. The quality of each film during the processes was observed so as to evaluate the process suitability into one of three grades as defined below in terms of wrinkling and printing misalignment.

Wrinkling

○: Substantially no wrinkling; good quality

Δ: Slight wrinkling observed

X: Planarity deterioration and wrinkling observed

Printing Misalignment
◯: Substantially no printing misalignment; good quality
Δ: Slight printing misalignment observed
X: Planarity deterioration and printing misalignment observed

(13) Film Formation

In Example C, no or one occurrence of film rupture during three hours of continuous biaxial drawing was considered as good, and two or more occurrences of film rupture was considered as poor.

(14) Gas Barrier Property

In Examples D, E and F, the oxygen permeability was measured by an oxygen permeability measuring apparatus ("OX-TRAN 10/50A" manufactured by Modern Controls) at a humidity of about 0%, a temperature of about 25° C. and a purge interval of about 2 days. The water vapor permeability was measured by a water vapor permeability measuring apparatus ("PERMATRAN" manufactured by Modern Controls) at a humidity of about 90%, a temperature of about 40° C. and a purge interval of about 2 days.

(15) Oxygen Permeability after Running the Film

In Examples D, E and F, the film was run at a high speed for a long time while pressing it against a metal guide roll. After the guide roll friction test, the oxygen permeability was measured by the method as described above.

(16) Oxygen Permeability After Bending Fatigue

In Examples D, E and F, bending fatigue was applied on the film using Gelboflex tester (manufactured by Tester Sangyo Co., Ltd.). According to MIL-B131H, a piece of a sample about 112"×8" was made into a form of a cylinder having a diameter of about 3(½)", and the sample piece was held at both ends with the initial holding interval of about 7". A twist of about 4000 was applied at an about 3(½)" stroke. The reciprocating movement was repeated at a rate of about 40 reciprocations/min, at a temperature of about 20° C. and at a relative humidity of about 65%. After the film was fatigued as described above, the oxygen permeability thereof was measured.

(17) Three-Dimensional Average Inclination Gradient SΔa

In Examples D, E and F, the surface roughness of the film was measured with a stylus type three-dimensional surface roughness meter (SE-3AK manufactured by Kosaka Kenkyusho). First, the surface roughness of the film was measured over about 1 mm along the longitudinal direction thereof under conditions including a stylus radius of about 2 μm, a load of about 30 mg, a cut-off value of about 0.25 mm, and a stylus speed of about 0.1 mm/sec. The obtained data was divided into 500 points at about 2 μm intervals, and the height at each point was input to a three-dimensional surface roughness analyzer (SPA-11). Similarly, the surface roughness of the film was measured over about 0.3 mm along the width direction thereof, for 150 points at about 2 μm intervals, and the data at each point was input to the analyzer at a quantization width of about 0.00312 μm. Then, using the analyzer, the value SΔa was obtained. SΔa denotes a three-dimensional average inclination gradient as defined below.

SΔa refers to an average inclination gradient across the entire film surface. At a plurality of levels parallel to the mean roughness plane, the number of protrusions of the film and the cross-sectional area thereof are obtained so as to calculate the average cross-sectional area of the protrusions for the respective levels. The average radius of the cross sections of the protrusions for each level is calculated from the average cross-sectional area, and a ratio of change in the height to change in the average protrusion radius is obtained for each level. The obtained values are further averaged to obtain the value SΔa.

Specifically, the value SΔa as used herein refers to a value obtained by using the above-described three-dimensional surface roughness meter to measure the heights of the sample film at a predetermined number of measurement positions which are arranged at regular intervals, and processing the measured values by the above-described three-dimensional surface roughness analyzer. More specifically, each obtained surface roughness curve is approximated to asine curve. The resulting data points are combined together so as to obtain three-dimensional data. The inclination gradient across the entire surface is calculated from the number and heights of protrusions while using the mean roughness plane as the reference plane.

A rectangular coordinates system is defined along the mean roughness plane with an X axis and a Y axis as well as a Z axis, which is defined orthogonal to the mean roughness plane. The value SΔa is obtained from a portion of the mean roughness plane having a length Lx along the X axis, and a length Ly along the Y axis, with an area of Lx×Ly=$S_M$, according to the following expression.

$$S\Delta a = \frac{1}{S_M} \int_0^{Lx} \int_0^{Ly} \sqrt{\left(\frac{\delta f}{\delta x}\right)^2 + \left(\frac{\delta f}{\delta y}\right)^2} \, dx dy$$

Herein, Z=f(x,y) denotes a function representing a film surface, i.e., the height Z, at a position (x,y) in the rectangular coordinates system as defined above.

In Examples D, E and F, the SΔa value was calculated according to the above expression, with Lx=500 and Ly=150.

(18) Number of Projections on the Film Surface

In Examples D, E and F, aluminum was vapor deposited on a surface of the film under vacuum. Using a two-beam interference microscope provided with a filter having a wavelength of about 0.54 μm, rings surrounding a projection were observed. A set of seven or more rings surrounding a projection (corresponding to a projection height of about 1.89 μm or more) was considered as a projection. The number of projections (or the number of ring sets) was counted over an area of about 1.3 mm², and the obtained count was calculated into the number of projections per a unit of area.

Examples A1, A2, A3, and Comparative Examples A1, A2

About 100 weight parts of L-lactide and about 0.03 weight part of tin octylate as a catalyst were charged in a reaction chamber. A reaction was allowed for about 1 hour while the temperature in the chamber was kept at about 190° C. After the reaction, the obtained reaction system was depressurized so as to distill off the remaining L-lactide, thus obtaining a polylactic acid. The reduced viscosity of the obtained polylactic acid was about 1.9 dl/g. A silica particle aggregate having an average particle size of about 1.8 μm (SYLYSIA 350 manufactured by Fuji-Silysia Chemical Ltd.) was used as a slip additive. Various amounts of the slip additive were added in the form of a slurry dispersed in L-lactide before initiating the L-lactide polymerization reaction. The amounts of slip additive added are shown in Table A below.

The above-described aliphatic polyester was dried in vacuum at about 110° C. for about 4 hours using an ordinary method, extruded from a T die at about 200° C., and adhered by a static charge around a casting drum at about 16° C. so as to be rapidly cooled and solidified. Thus, a cast film was obtained. The cast film was heated by a roll which has been heated to about 72° C., and then drawn in the longitudinal direction at a drawing ratio of about 3.3. Then, the drawn film was pre-heated to about 60° C. in a tenter, and drawn in the width direction at a drawing ratio of about 4.0 while being heated to about 75° C., and thermally fixed at about 150° C. Moreover, a lateral relaxing process was performed at about 150° C. for relaxing the film in the width direction by about 3%, thereby obtaining a biaxially drawn aliphatic polyester film having a thickness of about 12 μm. The characteristic values of the obtained drawn films are shown in Table A. The refractive index (Nx) of the film along the vertical direction thereof after the vertical drawing process (manufactured by Nippon Fine Chemical Co., Ltd.) was used as an organic slip additive. The results obtained are shown in Table A below.

Comparative Example A5

A film was produced in a manner similar to Comparative Example A4 except that no organic slip additive was added. The results obtained are shown in Table A below.

TABLE A

| | Inorganic slip additive | | Organic slip additive | | | | | | |
|---|---|---|---|---|---|---|---|---|---|
| | Average particle size μm | Amount added in weight part | Amount added in weight part | PCC (Projections/ mm$^2$) | SRa μm | 7000 – 45000 * SRa | Handling property | Haze % | Adhesiveness (g/15 mm) Dry/Wet |
| Example A1 | 1.8 | 0.10 | 0 | 1350 | 0.045 | 4975 | 4 | 3.1 | 308/211 |
| Example A2 | 1.8 | 0.20 | 0 | 1980 | 0.066 | 4030 | 4 | 6.5 | 310/190 |
| Example A3 | 1.8 | 0.01 | 0 | 330 | 0.018 | 6190 | 3 | 1.8 | 302/193 |
| Example A4 | 1.65 | 0.10 | 0 | 1750 | 0.069 | 3895 | 4 | 7.8 | 305/200 |
| Comparative Example A1 | 1.8 | 0.005 | 0 | 155 | 0.008 | 6640 | 2 | 0.9 | 308/203 |
| Comparative Example A2 | 1.8 | 0.60 | 0 | 3730 | 0.095 | 2725 | 2 | 14.3 | 306/198 |
| Comparative Example A3 | 5.8 | 0.12 | 0 | 1880 | 0.108 | 2140 | 3 | 10.3 | 303/215 |
| Comparative Example A4 | 0.007 | 0.50 | 1 | 600 | 0.008 | 6640 | 1 | 2.2 | 148/55 |
| Comparative Example A5 | 0.007 | 0.50 | 0 | 600 | 0.008 | 6640 | 1 | 2.0 | 290/185 | was about 1.469. Each of the films obtained in Examples A1, A2, A3, and Comparative Example A1 had a good transparency, while that obtained in Comparative Example A2 had a poor transparency.

Example A4

A film was produced in a manner similar to Example A1 except that about 0.10 weight part of spherical silica particles having an average diameter of about 1.65 μm (AMT-silica #100B and AMT-silica #100B manufactured by Mizusawa Industrial Chemicals Ltd.) as a slip additive. The results obtained are shown in Table A below. The refractive index (Nx) of the film along the vertical direction thereof after the vertical drawing process was about 1.467. The obtained film had a good transparency.

Comparative Example A3

A film was produced in a manner similar to Example A1 except that about 0.12 weight part of spherical silica particles having an average diameter of about 5.8 μm (AMT-silica #500B manufactured by Mizusawa Industrial Chemicals Ltd.) as a slip additive. The results obtained are shown in Table A below. The refractive index (Nx) of the film along the vertical direction thereof after the vertical drawing process was about 1.467. The obtained film had a poor transparency.

Comparative Example A4

A film was produced in a manner similar to Example A1 except that silica particles having an average particle size of about 7 nm (AEROSIL 300 manufactured by Nippon Aerosil Ltd.) were used as an inorganic slip additive, and Neutron S

Example B1

About 0.06 weight part of a silica particle aggregate having an average particle size of about 1.8 μm was added as a slip additive for forming surface projections to about 100 weight parts of a poly-L-lactic acid having a weight average molecular weight of about 250000, thereby obtaining an aliphatic polyester polymer. The polymer was extruded by an extrusion machine having a T die and a bore diameter of about 30 mm at a resin temperature of about 2100 C. Then, the extruded polymer was cooled by a chilled roll at about 20° C., thereby obtaining an undrawn film having a thickness of about 275 μm. The film was pre-heated to about 95° C. by a plurality of ceramic rolls, and vertically drawn between the rolls at a drawing rate of about 30000%/min and at a drawing ratio of about 1.4, and further vertically drawn at about 97° C. and at a drawing ratio of about 2.5. Then, the film was laterally drawn by a tenter-type drawing machine at about 100° C. and at drawing ratio of about 4, and then thermally fixed at about 150° C. Thereafter, a lateral relaxing process of about 3% was performed at about 130° C. The obtained film was heated to about 40° C. and subjected to a corona treatment, thereby obtaining a drawn film having a thickness of about 20 μm. The properties of the obtained film are shown in Table B below.

Comparative Example B1

A biaxially drawn film was obtained in a manner similar to Example B1 except that the drawing rate was changed to about 5000%/min. The properties of the obtained film are shown in Table B below.

Comparative Example B2

A biaxially drawn film was obtained in a manner similar to Example B1 except that the vertical drawing was performed in a single stage at about 65° C. and at a drawing ratio of about 3.5, without the second vertical drawing stage. The properties of the obtained film are shown in Table B below.

Comparative Example B3

A biaxially drawn film was obtained in a manner similar to Example B1 except that about 0.15 weight part of N,N'-ethylenebis(stearylamide) was added as a slip additive to about 100 weight parts of a polylactic acid. The properties of the obtained film are shown in Table B below.

Comparative Example B4

A biaxially drawn film was obtained in a manner similar to Example B1 except that a corona treatment was not performed. The properties of the obtained film are shown in Table B below.

Comparative Example C1

A biaxially drawn film was obtained in a manner similar to Example C1 except that, in the vertical drawing process, the film was pre-heated to about 96° C. by a plurality of ceramic rolls, and the film was vertically drawn in a single stage between the rolls at a drawing rate of about 30000%/min and at a drawing ratio of about 2.5, without the second vertical drawing stage. The properties of the obtained film are shown in Table C below.

Comparative Example C2

A biaxially drawn film was obtained in a manner similar to Example C1 except that the vertical drawing process was performed in a single stage at about 68° C. and at a drawing ratio of about 3.5, without the second vertical drawing stage. The properties of the obtained film are shown in Table C below.

Example C2

A biaxially drawn film was obtained in a manner similar to Example C1 except that the vertical drawing process was performed at about 12000%/min. The properties of the obtained film are shown in Table C below.

TABLE B

| | Example B1 | Comparative Example B1 | Comparative Example B2 | Comparative Example B3 | Comparative Example B4 |
|---|---|---|---|---|---|
| Nz | 1.4476 | 1.4552 | 1.4380 | 1.4475 | 1.4475 |
| Film formation | Good | Good | Many occurrences of rupture | Good | Good |
| Surface energy (dyne/cm) | 51 | 51 | 51 | 38 | 40 |
| Process suitability | ○ | Δ | X | ○ | ○ |
| Heat seal strength (g/15 mm) | | | | | |
| Without water | 600 | 700 | 400 | 60 | 200 |
| With water | 500 | 600 | 300 | 30 | 80 |

Example C1

About 0.06 weight part of a silica particle aggregate having an average particle size of about 1.8 μm was added as a slip additive for forming surface projections to about 100 weight parts of a poly-L-lactic acid (Tg=61.6° C., Tm=170° C.) having a weight average molecular weight of about 250000. The obtained composition was extruded by an extrusion machine having a T die and a bore diameter of about 30 mm at a resin temperature of about 210° C. Then, the extruded polymer was cooled by a chilled roll at about 200 C, thereby obtaining an undrawn film having a thickness of about 3000 μm. The film was pre-heated to about 96° C. by a plurality of ceramic rolls, and vertically drawn between the rolls at a drawing rate of about 30000%/min and at a drawing ratio of about 1.5, and further vertically drawn at about 98° C. and at a drawing ratio of about 2.7. Then, the film was laterally drawn by a tenter-type drawing machine at about 80° C. and at drawing ratio of about 3.8, and then thermally fixed at about 155° C. Thereafter, a lateral relaxing process of about 3% was performed at about 135° C. Thus, a biaxially drawn film of the present invention having a thickness of about 20 μm was obtained. The properties of the obtained film are shown in Table C below.

Comparative Example C3

A biaxially drawn film was obtained in a manner similar to Example C1 except that the thermofixing process was performed at about 140° C. The properties of the obtained film are shown in Table C below.

Example C3

A biaxially drawn film was obtained in a manner similar to Example C1 except that the thermofixing process was performed at about 150° C. The properties of the obtained film are shown in Table C below.

Example C4

A biaxially drawn film was obtained in a manner similar to Example C1 except that after the biaxial drawing process, the film was subjected to a heat treatment at about 100° C. for about 10 seconds and then thermally fixed. The properties of the obtained film are shown in Table C below.

TABLE C

|  | Example C1 | Comparative Example C1 | Comparative Example C2 | Example C2 | Comparative Example C3 | Example C3 | Example C4 |
|---|---|---|---|---|---|---|---|
| Thickness unevenness (%) | 2.2 | 12.1 | 13.3 | 8.5 | 2.4 | 2.5 | 1.5 |
| Thermal shrinkage (%) | 2.3 | 1.9 | 5.1 | 2.2 | 9.8 | 4.7 | 2.2 |
| Nz | 1.4461 | 1.4565 | 1.4394 | 1.4521 | 1.4475 | 1.4469 | 1.4463 |
| Nx − Ny | −0.0133 | −0.0211 | −0.0032 | −0.0207 | −0.0142 | −0.0136 | −0.0130 |
| Process suitability |  |  |  |  |  |  |  |
| Wrinkling | ○ | X | X | Δ | X | Δ | ○ |
| Printing misalignment | ○ | X | X | Δ | X | Δ | ○ |
| Film formation | Good | Good | Poor | Good | Good | Good | Good |

Example D1, and Comparative Example D1

About 100 weight parts of L-lactide and about 0.03-weight part of tin octylate as a catalyst were charged in a reaction chamber. A reaction was allowed for about 1 hour while the temperature in the chamber was kept at about 190° C. After the reaction, the obtained reaction system was depressurized so as to remove the remaining L-lactide, thus obtaining a polylactic acid. The reduced viscosity of the obtained polylactic acid was about 1.8 dl/g.

The above-described polylactic acid was dried in vacuum at about 110° C. for about 4 hours using an ordinary method, melted and extruded by an extrusion machine having a T die and a bore diameter of about 30 mm at a resin temperature of about 210° C. Then, the extruded polymer was cooled by a chilled roll, thereby obtaining an undrawn film having a thickness of about 300 μm. Then, the film was immediately vertically drawn by a roll-type drawing machine at about 75° C. and at a drawing ratio of about 3.2. The film was then laterally drawn by a tenter-type drawing machine at about 100° C. and at drawing ratio of about 4. Thereafter, the film was relaxed by about 6% while being thermally fixed at about 150° C. Then, a corona discharge treatment was performed on the film, thereby obtaining a drawn film having a thickness of about 25 μm.

An aluminum oxide/silicon oxide-based vapor-deposited layer was applied on the corona-discharge-treated biaxially drawn film using an electron beam heating-type vacuum deposition apparatus and using a vapor deposition source of $Al_2O_3$ and $SiO_2$ in the form of particles having a size of about 3 mm to about 5 mm. The depositing materials, $Al_2O_3$ and $SiO_2$, were not mixed together but alternately heated in a time division manner, while dividing the furnace into two chambers by a carbon plate, and using a single electron gun as a heat source. Various vapor-deposited layers were obtained by adjusting the emission current of the electron gun and the heating ratio between $Al_2O_3$ and $SiO_2$. After the resin layer of the obtained layered film was dissolved, the specific gravity of the aluminum oxide/silicon oxide-based vapor-deposited layer was measured by the sink and float method.

Example D2, and Comparative Example D2

A film with a vapor-deposited layer applied thereon was produced by a method as described in Example D1 except that various amounts of a silica particle aggregate having an average particle size of about 1.8 μm (SYLYSIA 350 manufactured by Fuji-Silysia Chemical Ltd.) as a slip additive were added in the form of a slurry dispersed in L-lactide before initiating the polymerization reaction. The amounts of slip additive added are shown in Table D below.

Comparative Example D3

A film with a vapor-deposited layer applied thereon was produced by a method as described in Example D1 except that various amounts of spherical silica particles having an average particle size of about 5.8 μm (AMT-silica #500B manufactured by Mizusawa Industrial Chemicals Ltd.) as a slip additive were added in the form of a slurry dispersed in L-lactide before initiating the polymerization reaction. The amounts of slip additive added are shown in Table D below.

Example E1, and Comparative Example E1

A polylactic acid was obtained by a method similar to the method of synthesizing a polylactic acid of Example D1.

A corona-discharge-treated biaxially drawn film was prepared by a method similar to the method of preparing a corona-discharge-treated biaxially drawn film of Example D1.

A vapor-deposited film was deposited on the obtained corona-discharge-treated biaxially drawn film using an electron beam heating-type vacuum deposition apparatus and using a vapor deposition source of $Al_2O_3$. Various vapor-deposited layers having various compositions were obtained by using a single electron gun as a heat source while adjusting the emission current and the vapor pressure. After the resin layer of the obtained layered film was dissolved, the specific gravity of the aluminum oxide-based vapor-deposited layer was measured by a sink and float method.

Example E2, and Comparative Example E2

A film with a vapor-deposited layer applied thereon was produced by a method as described in Example E1 except that various amounts of a silica particle aggregate having an average particle size of about 1.8 μm (SYLYSIA 350 manufactured by Fuji-Silysia Chemical Ltd.) as a slip additive were added in the form of a slurry dispersed in L-lactide before initiating the polymerization reaction. The amounts of slip additive added are shown in Table E below.

Comparative Example E3

A film with a vapor-deposited layer applied thereon was produced by a method as described in Example E1 except that various amounts of spherical silica particles having an average particle size of about 5.8 μm (AMT-silica #500B manufactured by Mizusawa Industrial Chemicals Ltd.) as a slip additive were added in the form of a slurry dispersed in L-lactide before initiating the polymerization reaction. The amounts of slip additive added are shown in Table E below.

Example F1, and Comparative Example F1

A polylactic acid was obtained by a method similar to the method of synthesizing a polylactic acid of Example D1.

A corona-discharge-treated biaxially drawn film was prepared by a method similar to the method of preparing a corona-discharge-treated biaxially drawn film of Example D1.

A vapor-deposited film was applied on the obtained corona-discharge-treated biaxially drawn film using an electron beam heating-type vacuum deposition apparatus and using a vapor deposition source of Si and $SiO_2$. The vapor-deposited materials were not mixed together, but placed respectively into two divided chambers, and alternately heated in a time division manner, while using an electron gun as a heat source. Various vapor-deposited layers having various compositions were obtained by adjusting the emission current and the heating ratio. After the resin layer of the obtained layered film was dissolved, the specific gravity of the silicon oxide-based vapor-deposited layer was measured by a sink and float method.

Example F2, and Comparative Example F2

A film with a vapor-deposited layer applied thereon was produced by a method as described in Example F1 except that various amounts of a silica particle aggregate having an average particle size of about 1.8 μm (SYLYSIA 350 manufactured by Fuji-Silysia Chemical Ltd.) as a slip additive were added in the form of a slurry dispersed in L-lactide before initiating the polymerization reaction. The amounts of slip additive added are shown in Table F below.

Comparative Example F3

A film with a vapor-deposited layer applied thereon was produced by a method as described in Example F1 except that various amounts of spherical silica particles having an average particle size of about 5.8 μm (AMT-silica #500B manufactured by Mizusawa Industrial Chemicals Ltd.) as a slip additive were added in the form of a slurry dispersed in L-lactide before initiating the polymerization reaction. The amounts of slip additive added are shown in Table F below.

In the following tables, "over" denotes that the oxygen permeability was too large to measure.

TABLE D1

| | Specific gravity of vapor-deposited layer g/cm³ | Composition of vapor-deposited layer | | Thickness of vapor-deposited layer Å | Haze % | SΔa — | Number of projections Projections/mm² | Oxygen permeability cc/m² 24 h atm | | |
|---|---|---|---|---|---|---|---|---|---|---|
| | | $Al_2O_3$ wt % | $SiO_2$ wt % | | | | | Initial value | After running | After bending fatigue |
| Example D1-1 | 1.85 | 20 | 80 | 800 | 0.4 | 0.003 | 0 | 1.0 | 1.8 | 1.3 |
| Example D1-2 | 1.92 | 20 | 80 | 1000 | 0.4 | 0.003 | 0 | 1.0 | 2.2 | 1.5 |
| Example D1-3 | 2.07 | 20 | 80 | 2000 | 0.4 | 0.003 | 0 | 0.8 | 3.6 | 3.1 |
| Example D1-4 | 2.18 | 20 | 80 | 2000 | 0.4 | 0.003 | 0 | 0.7 | 4.1 | 3.5 |
| Example D1-5 | 2.30 | 20 | 80 | 3000 | 0.4 | 0.003 | 0 | 0.5 | 5.0 | 4.0 |
| Example D1-6 | 2.01 | 40 | 60 | 700 | 0.4 | 0.003 | 0 | 0.9 | 1.9 | 1.2 |
| Example D1-7 | 2.21 | 40 | 60 | 1000 | 0.4 | 0.003 | 0 | 0.7 | 2.2 | 1.6 |
| Example D1-8 | 2.38 | 40 | 60 | 1000 | 0.4 | 0.003 | 0 | 0.7 | 2.4 | 1.8 |
| Example D1-9 | 2.42 | 40 | 60 | 2000 | 0.4 | 0.003 | 0 | 0.5 | 2.4 | 2.0 |
| Example D1-10 | 2.55 | 40 | 60 | 3000 | 0.4 | 0.003 | 0 | 0.2 | 3.2 | 2.5 |
| Example D1-11 | 2.23 | 60 | 40 | 800 | 0.4 | 0.003 | 0 | 0.9 | 2.0 | 1.5 |
| Example D1-12 | 2.36 | 60 | 40 | 1000 | 0.4 | 0.003 | 0 | 0.6 | 2.3 | 1.7 |
| Example D1-13 | 2.52 | 60 | 40 | 1000 | 0.4 | 0.003 | 0 | 0.5 | 2.7 | 2.0 |
| Example D1-14 | 2.61 | 60 | 40 | 2000 | 0.4 | 0.003 | 0 | 0.3 | 3.0 | 2.4 |
| Example D1-15 | 2.79 | 60 | 40 | 3000 | 0.4 | 0.003 | 0 | 0.2 | 3.3 | 2.8 |
| Example D1-16 | 2.55 | 80 | 20 | 1000 | 0.4 | 0.003 | 0 | 0.8 | 1.8 | 1.1 |
| Example D1-17 | 2.71 | 80 | 20 | 1000 | 0.4 | 0.003 | 0 | 0.6 | 2.1 | 1.3 |
| Example D1-18 | 2.89 | 80 | 20 | 1000 | 0.4 | 0.003 | 0 | 0.5 | 2.5 | 1.7 |
| Example D1-19 | 2.97 | 80 | 20 | 2000 | 0.4 | 0.003 | 0 | 0.5 | 2.9 | 1.9 |
| Example D1-20 | 2.99 | 80 | 20 | 4000 | 0.4 | 0.003 | 0 | 0.2 | 3.3 | 2.3 |
| Example D1-21 | 2.61 | 95 | 5 | 1000 | 0.4 | 0.003 | 0 | 1.0 | 1.9 | 1.3 |
| Example D1-22 | 2.76 | 95 | 5 | 2000 | 0.4 | 0.003 | 0 | 0.8 | 2.0 | 1.5 |
| Example D1-23 | 2.87 | 95 | 5 | 2000 | 0.4 | 0.003 | 0 | 0.5 | 2.3 | 1.5 |
| Example D1-24 | 2.99 | 95 | 5 | 3000 | 0.4 | 0.003 | 0 | 0.5 | 2.6 | 1.7 |
| Example D1-25 | 3.13 | 95 | 5 | 4000 | 0.4 | 0.003 | 0 | 0.3 | 2.9 | 2.9 |

TABLE D2

| | Specific gravity of vapor-deposited layer g/cm³ | Composition of vapor-deposited layer | | Thickness of vapor-deposited layer Å | Haze % | SΔa — | Number of projections Projections/mm² | Oxygen permeability cc/m² 24 h atm | | |
|---|---|---|---|---|---|---|---|---|---|---|
| | | $Al_2O_3$ wt % | $SiO_2$ wt % | | | | | Initial value | After running | After bending fatigue |
| Comparative example D1-1 | 1.65 | 15 | 85 | 1000 | 0.4 | 0.003 | 0 | 2.4 | 3.9 | 3.0 |
| Comparative example D1-2 | 2.38 | 15 | 85 | 2000 | 0.4 | 0.003 | 0 | 0.8 | Over | Over |
| Comparative example D1-3 | 1.90 | 15 | 85 | 1000 | 0.4 | 0.003 | 0 | 1.8 | 4.0 | 3.0 |
| Comparative example D1-4 | 2.15 | 15 | 85 | 1000 | 0.4 | 0.003 | 0 | 1.5 | 3.8 | 2.8 |

TABLE D2-continued

|  | Specific gravity of vapor-deposited layer g/cm³ | Composition of vapor-deposited layer | | Thickness of vapor-deposited layer Å | Haze % | SΔa — | Number of projections Projections/mm² | Oxygen permeability cc/m² 24 h atm | | |
|---|---|---|---|---|---|---|---|---|---|---|
|  |  | Al₂O₃ wt % | SiO₂ wt % |  |  |  |  | Initial value | After running | After bending fatigue |
| Comparative example D1-5 | 1.70 | 20 | 80 | 1000 | 0.4 | 0.003 | 0 | 2.0 | 3.6 | 2.8 |
| Comparative example D1-6 | 2.45 | 20 | 80 | 3000 | 0.4 | 0.003 | 0 | 0.5 | Over | Over |
| Comparative example D1-7 | 1.88 | 40 | 60 | 700 | 0.4 | 0.003 | 0 | 1.9 | 3.4 | 2.7 |
| Comparative example D1-8 | 2.65 | 40 | 60 | 3000 | 0.4 | 0.003 | 0 | 0.2 | Over | Over |
| Comparative example D1-9 | 2.15 | 60 | 40 | 800 | 0.4 | 0.003 | 0 | 1.2 | 3.0 | 1.9 |
| Comparative example D1-10 | 2.93 | 60 | 40 | 3000 | 0.4 | 0.003 | 0 | 0.3 | Over | Over |
| Comparative example D1-11 | 2.38 | 80 | 20 | 1000 | 0.4 | 0.003 | 0 | 1.0 | 2.9 | 1.6 |
| Comparative example D1-12 | 3.21 | 80 | 20 | 4000 | 0.4 | 0.003 | 0 | 0.2 | Over | Over |
| Comparative example D1-13 | 2.50 | 95 | 5 | 1000 | 0.4 | 0.003 | 0 | 1.6 | 3.1 | 2.0 |
| Comparative example D1-14 | 3.20 | 95 | 5 | 4000 | 0.4 | 0.003 | 0 | 0.2 | Over | Over |

TABLE D3

|  | Specific gravity of vapor-deposited layer g/cm³ | Composition of vapor-deposited layer | | Thickness of vapor deposited layer Å | Haze % | Amount of slip additive added wt % | SΔa — | Number of projections projections/mm² | Oxygen permeability cc/m² 24 h atm | | |
|---|---|---|---|---|---|---|---|---|---|---|---|
|  |  | Al₂O₃ wt % | SiO₂ wt % |  |  |  |  |  | Initial value | After running | After bending fatigue |
| Example D2-1 | 2.20 | 20 | 80 | 2000 | 2.6 | 0.08 | 0.015 | 0 | 0.7 | 3.3 | 3.2 |
| Example D2-2 | 2.41 | 40 | 60 | 2000 | 2.6 | 0.08 | 0.015 | 0 | 0.7 | 2.1 | 2.0 |
| Example D2-3 | 2.60 | 60 | 40 | 2000 | 2.6 | 0.08 | 0.015 | 0 | 0.5 | 2.0 | 1.9 |
| Example D2-4 | 2.85 | 80 | 20 | 2000 | 2.6 | 0.08 | 0.015 | 0 | 0.5 | 2.2 | 2.0 |
| Example D2-5 | 2.21 | 20 | 80 | 2000 | 4.4 | 0.16 | 0.036 | 0 | 0.6 | 2.9 | 2.8 |
| Example D2-6 | 2.43 | 40 | 60 | 2000 | 4.4 | 0.16 | 0.036 | 0 | 0.5 | 2.1 | 2.0 |
| Example D2-7 | 2.59 | 60 | 40 | 2000 | 4.4 | 0.16 | 0.036 | 0 | 0.5 | 1.8 | 1.8 |
| Example D2-8 | 2.84 | 80 | 20 | 2000 | 4.4 | 0.16 | 0.036 | 0 | 0.7 | 2.2 | 2.1 |

TABLE D4

|  | Specific gravity of vapor-deposited layer g/cm³ | Composition of vapor-deposited layer | | Thickness of vapor deposited layer Å | Haze % | Amount of slip additive added wt % | SΔa | Number of projections projections/mm² | Oxygen permeability cc/m² 24 h atm | | |
|---|---|---|---|---|---|---|---|---|---|---|---|
|  |  | Al₂O₃ wt % | SiO₂ wt % |  |  |  |  |  | Initial value | After running | After bending fatigue |
| Compalative Example D2-1 | 1.85 | 40 | 60 | 2000 | 5.0 | 0.56 | 0.045 | 0 | 2.3 | 3.0 | 2.9 |
| Compalative Example D2-2 | 2.66 | 40 | 60 | 2000 | 5.0 | 0.56 | 0.045 | 0 | 0.3 | Over | Over |
| Compalative Example D2-3 | 2.14 | 60 | 40 | 2000 | 5.0 | 0.56 | 0.045 | 0 | 2.0 | 3.3 | 2.9 |
| Compalative Example D2-4 | 2.94 | 60 | 40 | 2000 | 5.0 | 0.56 | 0.045 | 0 | 0.2 | Over | Over |
| Compalative Example D3-1 | 1.84 | 40 | 60 | 2000 | 8.0 | 0.13 | 0.035 | 14 | 2.2 | 2.6 | 2.5 |
| Compalative Example D3-2 | 2.67 | 40 | 60 | 2000 | 8.0 | 0.13 | 0.035 | 14 | 0.4 | Over | Over |
| Compalative Example D3-4 | 2.12 | 60 | 40 | 2000 | 8.0 | 0.13 | 0.035 | 14 | 2.2 | 2.9 | 2.8 |
| Compalative Example D3-5 | 2.95 | 60 | 40 | 2000 | 8.0 | 0.13 | 0.035 | 14 | 0.3 | Over | Over |

TABLE E1

| | Specific gravity of vapor-deposited layer g/cm³ | Thickness of vapor-deposited layer Å | Haze % | SΔa — | Number of projections Projections/mm² | Oxygen permeability cc/m² 24 h atm | | |
|---|---|---|---|---|---|---|---|---|
| | | | | | | Initial value | After running | After bending fatigue |
| Example E1-1 | 2.72 | 500 | 0.3 | 0.004 | 0 | 1.9 | 2.9 | 2.0 |
| Example E1-2 | 2.88 | 500 | 0.3 | 0.004 | 0 | 1.7 | 3.0 | 2.1 |
| Example E1-3 | 2.97 | 500 | 0.3 | 0.004 | 0 | 1.6 | 3.2 | 2.2 |
| Example E1-4 | 3.05 | 1000 | 0.3 | 0.004 | 0 | 1.6 | 3.3 | 2.4 |
| Example E1-5 | 3.11 | 1000 | 0.3 | 0.004 | 0 | 1.4 | 3.3 | 2.4 |
| Example E1-6 | 3.01 | 2000 | 0.3 | 0.004 | 0 | 1.2 | 3.4 | 2.6 |
| Example E1-7 | 3.06 | 2000 | 0.3 | 0.004 | 0 | 1.1 | 3.5 | 2.7 |
| Example E1-8 | 3.14 | 3000 | 0.3 | 0.004 | 0 | 1.0 | 3.7 | 2.7 |
| Example E1-9 | 3.20 | 3000 | 0.3 | 0.004 | 0 | 1.0 | 4.0 | 2.9 |
| Example E1-10 | 3.29 | 3000 | 0.3 | 0.004 | 0 | 0.9 | 4.2 | 3.0 |

TABLE E2

| | Specific gravity of vapor-deposited layer g/cm³ | Thickness of vapor-deposited layer Å | Haze % | SΔa — | Number of projections Projections/mm² | Oxygen permeability cc/m² 24 h atm | | |
|---|---|---|---|---|---|---|---|---|
| | | | | | | Initial value | After running | After bending fatigue |
| Compalative Example E1-1 | 2.72 | 500 | 0.3 | 0.004 | 0 | 2.5 | 5.5 | 5.0 |
| Compalative Example E1-2 | 2.65 | 1000 | 0.3 | 0.004 | 0 | 2.4 | 6.7 | 6.3 |
| Compalative Example E1-3 | 3.35 | 3000 | 0.3 | 0.004 | 0 | 0.8 | Over | Over |
| Compalative Example E1-4 | 3.40 | 3000 | 0.3 | 0.004 | 0 | 0.7 | Over | Over |

TABLE E3

| | Specific gravity of vapor-deposited layer g/cm³ | Thickness of vapor-deposited layer Å | Haze % | Amount of slip additive added wt % | SΔa — | Number of projections Projections/mm² | Oxygen permeability cc/m² 24 h atm | | |
|---|---|---|---|---|---|---|---|---|---|
| | | | | | | | Initial value | After running | After bending fatigue |
| Example E2-1 | 3.02 | 1000 | 2.7 | 0.09 | 0.018 | 0 | 1.2 | 2.6 | 2.5 |
| Example E2-2 | 3.05 | 1000 | 4.9 | 0.18 | 0.038 | 0 | 1.1 | 2.5 | 2.7 |
| Compalative Example E2-1 | 2.63 | 500 | 13.0 | 0.56 | 0.044 | 0 | 2.4 | 6.5 | 6.2 |
| Compalative Example E2-2 | 3.38 | 3000 | 13.6 | 0.56 | 0.042 | 0 | 0.8 | Over | Over |
| Compalative Example E3-1 | 2.65 | 500 | 11.0 | 0.13 | 0.039 | 14 | 2.3 | 7.0 | 6.8 |
| Compalative Example E3-2 | 3.39 | 3000 | 10.6 | 0.13 | 0.038 | 10 | 0.9 | Over | Over |

TABLE F1

| | Specific gravity of vapor-deposited layer g/cm³ | Thickness of vapor-deposited layer Å | Haze % | SΔa — | Number of projections Projections/mm² | Oxygen permeability cc/m² 24 h atm | | |
|---|---|---|---|---|---|---|---|---|
| | | | | | | Initial value | After running | After bending fatigue |
| Example F1-1 | 1.80 | 500 | 0.3 | 0.005 | 0 | 1.7 | 2.7 | 1.7 |
| Example F1-2 | 1.85 | 500 | 0.3 | 0.005 | 0 | 1.6 | 2.7 | 1.7 |
| Example F1-3 | 1.92 | 500 | 0.3 | 0.005 | 0 | 1.6 | 2.8 | 1.7 |
| Example F1-4 | 1.97 | 1000 | 0.3 | 0.005 | 0 | 1.4 | 3.0 | 1.8 |
| Example F1-5 | 2.01 | 1000 | 0.3 | 0.005 | 0 | 1.0 | 3.2 | 2.0 |
| Example F1-6 | 1.98 | 2000 | 0.3 | 0.005 | 0 | 0.8 | 3.5 | 2.2 |
| Example F1-7 | 2.02 | 2000 | 0.3 | 0.005 | 0 | 0.8 | 3.6 | 2.2 |
| Example F1-8 | 2.05 | 3000 | 0.3 | 0.005 | 0 | 0.7 | 3.8 | 2.4 |
| Example F1-9 | 2.13 | 3000 | 0.3 | 0.005 | 0 | 0.7 | 3.8 | 2.5 |
| Example F1-10 | 2.20 | 3000 | 0.3 | 0.005 | 0 | 0.7 | 4.0 | 3.1 |

TABLE F2

|  | Specific gravity of vapor-deposited layer g/cm³ | Thickness of vapor-deposited layer Å | Haze % | SΔa — | Number of projections Projections/mm² | Oxygen permeability cc/m² 24 h atm | | |
|---|---|---|---|---|---|---|---|---|
|  |  |  |  |  |  | Initial value | After running | After bending fatigue |
| Comparative Example F1-1 | 1.73 | 500 | 0.3 | 0.005 | 0 | 2.4 | 4.8 | 4.5 |
| Comparative Example F1-2 | 1.78 | 1000 | 0.3 | 0.005 | 0 | 1.9 | 6.8 | 4.8 |
| Comparative Example F1-3 | 2.25 | 3000 | 0.3 | 0.005 | 0 | 0.8 | Over | Over |
| Comparative Example F1-4 | 2.30 | 3000 | 0.3 | 0.005 | 0 | 0.6 | Over | Over |

TABLE F3

|  | Specific gravity of vapor-deposited layer g/cm³ | Thickness of vapor-deposited layer Å | Haze % | Amount of slip additive added wt % | SΔa — | Number of projections Projections/mm² | Oxygen permeability cc/m² 24 h atm | | |
|---|---|---|---|---|---|---|---|---|---|
|  |  |  |  |  |  |  | Initial value | After running | After bending fatigue |
| Example F2-1 | 2.01 | 1000 | 2.8 | 0.08 | 0.019 | 0 | 1.0 | 2.0 | 2.1 |
| Example F2-2 | 2.02 | 1000 | 4.8 | 0.16 | 0.037 | 0 | 1.0 | 1.9 | 2.0 |
| Compalative Example F2-1 | 1.78 | 500 | 13.2 | 0.56 | 0.044 | 0 | 2.4 | 4.5 | 4.3 |
| Compalative Example F2-2 | 2.31 | 3000 | 13.4 | 0.56 | 0.042 | 0 | 0.8 | Over | Over |
| Compalative Example F3-1 | 1.77 | 500 | 10.8 | 0.13 | 0.039 | 12 | 2.3 | 6.9 | 6.5 |
| Compalative Example F3-2 | 2.32 | 3000 | 10.2 | 0.13 | 0.038 | 11 | 0.9 | Over | Over |

According to the present invention, it is possible to obtain a biaxially drawn aliphatic polyester film having desirable handling property, transparency and adhesiveness, which is suitable for packaging applications, and the like.

The aliphatic polyester film of the present invention has a desirable suitability for processes such as printing and laminating processes, which is an important practical property of a packaging film. The aliphatic polyester film also has a desirable heat seal strength after being made into a bag. Thus, the present invention provides a very useful and environment-friendly general packaging film.

The aliphatic polyester film of the present invention has a desirable process suitability, and does not undergo a change in dimension or wrinkling during processes such as printing and laminating processes. This is an important property of a packaging film for use with fresh food, processed food, drugs, medical devices, electronics, or the like. Moreover, the aliphatic polyester film of the present invention does not undergo planarity deterioration or printing misalignment, thus being very useful as a general packaging film.

According to the present invention, it is possible to obtain a gas barrier film which has desirable transparency, flexibility, running property during the film processing, and gas barrier property after the film has run through a film processing machine while being in contact with a part thereof, which are important properties required in a general packaging film.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A gas barrier film, comprising a resin layer and a vapor-deposited layer which is applied on at least one side of the resin layer, wherein:

the resin layer comprises, as its main component, an aliphatic polyester whose primary repeating unit is represented by a general formula —O—CHR—CO— (where R denotes H or an alkyl group having a carbon number of 1–3);

the vapor-deposited layer is selected from the group consisting of an aluminum oxide/silicon oxide-based vapor-deposited layer, an aluminum oxide-based vapor-deposited layer and a silicon oxide-based vapor-deposited layer;

a content of aluminum oxide in the aluminum oxide/silicon oxide-based vapor-deposited layer is about 20 wt % to about 99 wt %;

a "b" value, which is calculated according to the following expression (1) based on a specific gravity D of the vapor-deposited layer and the aluminum oxide content A in wt % in the vapor-deposited layer, satisfies the following expression (2):

Expression (1): b=D−0.01A

Expression (2): $1.6 \leq b \leq 2.2$ (where D denotes the specific gravity of the vapor-deposited layer, and A denotes the aluminum oxide content in wt % in the vapor-deposited layer);

a specific gravity of the aluminum oxide-based vapor-deposited layer is about 2.70 to about 3.30; and a specific gravity of the silicon oxide-based vapor-deposited layer is about 1.80 to about 2.20.

2. A film according to claim 1, wherein:

a three-dimensional surface roughness SΔa (a three-dimensional average inclination gradient) of at least the deposition side of the resin layer is about 0.01 to about 0.04; and substantially no projection as high as about 1.89 µm or more exists on at least the deposition side of the resin layer.

3. A film according to claim 2, wherein:

a thickness of the resin layer is about 10 µm to about 250 µm; and a thickness of the vapor-deposited layer is about 10 Å to about 5000 Å.

4. A film according to claim 2, wherein the aliphatic polyester is a polylactic acid.

* * * * *